United States Patent
Ban

(10) Patent No.: US 7,463,516 B2
(45) Date of Patent: Dec. 9, 2008

(54) FLASH MEMORIES WITH ADAPTIVE REFERENCE VOLTAGES

(75) Inventor: Amir Ban, Ramat Hasharon (IL)

(73) Assignee: SanDisk IL, Ltd, Kfar Saba, IL (US)

( * ) Notice: Subject to any disclaimer, the term of this patent is extended or adjusted under 35 U.S.C. 154(b) by 0 days.

(21) Appl. No.: 11/923,677

(22) Filed: Oct. 25, 2007

(65) Prior Publication Data

US 2008/0094907 A1    Apr. 24, 2008

Related U.S. Application Data

(63) Continuation of application No. 10/867,645, filed on Jun. 16, 2004, now Pat. No. 7,372,731.

(60) Provisional application No. 60/479,895, filed on Jun. 17, 2003.

(51) Int. Cl.
*G11C 11/34* (2006.01)

(52) U.S. Cl. .............. 365/185.03; 365/185.24; 365/185.2

(58) Field of Classification Search ........... 365/185.03, 365/185.24, 185.2, 185.33, 185.18, 189.07, 365/189.09
See application file for complete search history.

(56) References Cited

U.S. PATENT DOCUMENTS

| 5,163,021 A | 11/1992 | Mehrotra et al. |
| 5,404,485 A | 4/1995 | Ban |
| 5,867,429 A | 2/1999 | Chen et al. |
| 5,937,425 A | 8/1999 | Ban |
| 2003/0002334 A1* | 1/2003 | Ho Chang .............. 365/185.03 |
| 2005/0007820 A1* | 1/2005 | Chindalore et al. ...... 365/185.2 |
| 2006/0028875 A1 | 2/2006 | Avraham et al. |

* cited by examiner

*Primary Examiner*—Dang T Nguyen
(74) *Attorney, Agent, or Firm*—Mark M. Friedman

(57) ABSTRACT

Cells of a flash memory are read by determining respective adaptive reference voltages for the cells and comparing the cells' threshold voltages to their respective reference voltages. The adaptive reference voltages are determined either from analog measurements of the threshold voltages of the cells' neighbors or from preliminary estimates of the cells' threshold voltages based on comparisons of the cells' threshold voltages with integral or fractional reference voltages common to all the cells. Cells of a flash memory also are read by comparing the cells' threshold voltages to integral reference voltages, comparing the threshold voltages of cells that share a common bit pattern to a fractional reference voltage, and adjusting the reference voltages in accordance with the comparisons.

10 Claims, 5 Drawing Sheets

FLASH MEMORIES WITH ADAPTIVE REFERENCE VOLTAGES

This is a Continuation of U.S. patent application Ser. No. 10/867,645 filed Jun. 16, 2004, which is a continuation-in-part of U.S. Provisional Patent Application No. 60/479,895, filed Jun. 17, 2003

FIELD AND BACKGROUND OF THE INVENTION

The present invention relates to flash memories and, more particularly, to methods for reading such memories more reliably.

Originally, flash memories stored only one bit per cell. Flash memories that store two bits per cell now are available commercially, and flash memories that store more than two bits per cell are being developed. Flash memories that store one bit per cell are called "Single Level Cell" (SLC) memories. Flash memories that store more than one bit per cell are called "Multi Level Cell" (MLC) memories.

FIG. 1 illustrates how a bit pattern of three bits is stored in a MLC memory that is capable of storing three bits per cell.

The threshold voltage of a flash cell is in a range, called the "voltage window", from a minimum value $V_{min}$ to a maximum value $V_{max}$. For historical reasons, writing data to a flash cell is called "programming" the flash cell. This is done by applying voltage pulses to the cell, to inject electrons from the cell's silicon substrate through the cell's oxide layer into the cell's floating gate, until the threshold voltage of the cell is high enough within the voltage window to represent the desired bit pattern. In a three-bit-per-cell memory, the voltage window is divided into eight voltage bands: from $V_{min}$ to $V_1$, from $V_1$ to $V_2$, from $V_2$ to $V_3$, from $V_3$ to $V_4$, from $V_4$ to $V_5$, from $V_5$ to $V_6$, from $V_6$ to $V_7$ and from $V_7$ to $V_{max}$. A threshold voltage within one of the voltage bands represents a bit pattern as shown in FIG. 1: a threshold voltage between $V_{min}$ and $V_1$ represents the bit pattern "111", a threshold voltage between $V_1$ and $V_2$ represents the bit pattern "110", etc. In general, the voltage window of a m-bit-per-cell memory is divided into $2^m$ voltage bands.

To read a flash cell, the threshold voltage of the flash cell is compared to the reference voltages that define the voltage bands. In the case of some flash memories (hereinafter called "type 1" memories), reading a cell that stores a bit pattern of m bits requires m such comparisons. For example, when m=3, as illustrated in FIG. 1, the threshold voltage first is compared to $V_4$. Depending on the outcome of that comparison, the threshold voltage is compared to either $V_2$ or $V_6$. Depending on the outcome of the second comparison, the threshold voltage is compared to either $V_1$ or $V_3$ or $V_5$ or $V_7$. Note that this comparison does not assume prior knowledge of the threshold voltage: circuitry in the flash memory returns a signal indicating whether the threshold voltage is higher or lower than the reference voltage to which it is being compared.

In the case of some other flash memories (hereinafter called "type 2 memories"), the threshold values of all the cells that are read collectively are compared to all $2^m-1$ reference voltages between $V_{min}$ and $V_{max}$.

In a collection of flash cells, the threshold voltages of the cells are distributed statistically around the centers of their respective voltage bands. FIG. 1 shows the threshold voltages in the first voltage band distributed according to a distribution curve 10, the threshold voltages in the second voltage band distributed according to a distribution curve 12, the threshold voltages in the third voltage band distributed according to a distribution curve 14, the threshold voltages in the fourth voltage band distributed according to a distribution curve 16, the threshold voltages in the fifth band distributed according to a distribution curve 18, the threshold voltages in the sixth band distributed according to a distribution curve 20, the threshold voltages in the seventh band distributed according to a distribution curve 22 and the threshold voltages in the eighth band distributed according to a distribution curve 24. There are several reasons for the finite widths of these distributions:

1. The programming process is a stochastic one that relies on inherently stochastic processes such as quantum mechanical tunneling and hot injection.

2. The precision of the read/program circuitry is finite and is limited by random noise.

3. In some flash technologies, the threshold voltage of a cell being read is affected by the threshold voltages of neighboring cells.

4. Chip-to-chip variations and variations in the manufacturing process cause some cells to behave differently than other cells when read/programmed.

In addition, the threshold voltage distributions tend to change over time, as follows:

1. As a flash memory is programmed and erased, the voltage window tends to shrink and the voltage bands become biased. These phenomena limit the number of times a MLC flash memory can be erased and re-programmed.

2. The threshold voltage of a flash cell that is not programmed for a long time tends to drift downward. This phenomenon limits the time that data can be reliably retained in a flash memory.

The voltage bands of a flash cell should be designed to be wide enough to accommodate all these phenomena, but not too wide. A voltage band that is too narrow, relative to the associated threshold voltage distribution curve and relative to the drift of that curve over time, leads to an unacceptably high bit error rate. Making the voltage bands very wide relative to the associated threshold voltage distributions limits the number of bits in the bit patterns that can be stored in the flash cell. In practice, flash memories are designed to have one error per $10^{14}$-$10^{16}$ bits read. Some flash technologies are unable to achieve this error rate while storing the desired number of bits per cell. Some flash memories based on such technology use error correction circuits to compensate for their high intrinsic error rates. Some NAND flash manufacturers have instructed their customers to incorporate error-correcting code in their applications.

There is thus a widely recognized need for, and it would be highly advantageous to have, methods of reading flash cells that are more reliable than those known in the art.

DEFINITIONS

Reference voltages, such as the reference voltages illustrated in FIG. 1, that demark the boundaries of the voltage bands inside the voltage window, are termed "integral reference voltages" herein. The present invention introduces reference voltages that lie within voltage bands; such reference voltages are termed "fractional reference voltages" herein. Note that the voltages that define the voltage window itself ($V_{min}$ and $V_{max}$ in FIG. 1) are not considered reference voltages herein.

A bit pattern that has more than one bit has a least significant bit and a most significant bit. A bit pattern that has more than two bits has bits of different significance between the least significant bit and the most significant bit. In a bit pattern of m bits, the least significant bit is termed herein the bit of "significance level 0", the next-to-least significant bit is termed herein the bit of "significance level 1", etc., until the most significant bit is termed herein the bit of "significance level m−1".

Bits of one or more bit patterns also are grouped herein in "significance groups" that include bits of one or more significance levels. A significance group is a group of bits of consecutive significance levels. Like the significance levels of the bits of a bit pattern, the significance groups of the bits of one or more bit patterns are ordered from a least significant bit group to a most significant bit group. For example, the bits of three-bit bit patterns can be grouped into bit groups in four different ways. The first way is to form three bit groups: one bit group with the least significant bits (the bits of significance level 0), one bit group with the next-to-least significant bits (the bits of significance level 1), and one bit group with the most significant bits. The second way is to form two bit groups: one bit group with the least significant bits and one group with the bits of significance levels 1 and 2. The third way is to form two bit groups: one bit group with the bits of significance levels 0 and 1 and one bit group with the most significant bits. The fourth way is to treat the entire set of bit patterns as a single bit group.

SUMMARY OF THE INVENTION

According to the present invention there is provided a method of reading a plurality of cells of a flash memory, including the steps of: (a) for each cell: (i) determining at least one respective reference voltage for the each cell; and (ii) comparing a threshold voltage of the each cell to the at least one respective reference voltage.

According to the present invention there is provided a flash memory including: (a) a plurality of cells; and (b) for each cell: a circuit for: (i) reading a threshold voltage of at least one neighbor of the each cell, and (ii) setting at least one respective reference voltage for the each cell based on the threshold voltage of the at least one neighbor of the each cell.

According to the present invention there is provided a flash memory including: (a) a plurality of cells; and (b) a controller for: (i) obtaining a preliminary estimate of a threshold voltage of each cell by comparing the threshold voltage to at least one nominal reference voltage that is common to all the cells, and (ii) based on the preliminary estimates, determining at least one respective reference voltage for each cell.

According to the present invention there is provided a method of reading a plurality of flash memory cells, including the steps of: (a) providing at least one integral reference voltage and at least one fractional reference voltage; (b) comparing a threshold voltage of each cell of the plurality to the at least one integral reference voltage and to the at least one fractional reference voltage to determine at least one statistic of the threshold voltages for the plurality of flash memory cells; and (c) adjusting at least one of the at least one integral reference voltage and the at least one fractional reference voltage in accordance with the at least one statistic.

According to the present invention there is provided a flash memory including: (a) a plurality of cells; and (b) a controller for reading the cells by: (i) providing at least one integral reference voltage and at least one fractional reference voltage, (ii) comparing a threshold voltage of each cell of the plurality to the at least one integral reference voltage and to the at least one fractional reference voltage to determine at least one statistic of the threshold voltages for the plurality of flash memory cells, and (iii) adjusting at least one of the at least one integral reference voltage and the at least one fractional reference voltage in accordance with the at least one statistic.

According to the basic method of the present invention, a flash cell (either a SLC cell or a MLC cell) is read by comparing the cell's threshold voltage to at least one integral reference voltage and to one or more fractional reference voltages.

Preferably, a plurality of integral reference voltages is provided, and the threshold voltage is compared to the fractional reference voltage(s) only if the comparison(s) to the integral reference voltages indicate that the threshold voltage is between the lowest and highest integral reference voltages.

Preferably, a plurality of integral reference voltages is provided, and if the comparisons of the cell's threshold voltage to the integral reference voltage(s) indicates that the threshold voltage is between two consecutive integral reference voltages, then the fractional reference voltage to which the threshold voltage is compared is between those two consecutive integral reference voltages.

A first application of the basic method of the present invention is to reading the cells, of a flash memory, whose threshold values are influenced by the threshold values of their neighbors. Instead of using (a) common reference voltage(s) for all the cells, at least one respective adaptive reference voltage is determined for each cell. The cells are read by comparing their threshold voltages to their respective adaptive reference voltages.

In a preferred embodiment of this aspect of the present invention, the determination of each cell's respective adaptive reference voltage(s) is based on a (preferably analog) measurement of the threshold voltages of one or more neighboring cells.

In a preferred digital embodiment of this aspect of the present invention, a preliminary estimate of each cell's threshold voltage is obtained by comparing the threshold voltage to at least one nominal reference voltage that is common to all the cells. Then, the determination of each cell's respective adaptive reference voltage(s) is based on the preliminary estimates of the threshold voltages of one or more neighboring cells. The nominal reference voltages are integral reference voltages and/or fractional reference voltages.

The scope of the present invention includes two embodiments of flash memories that use the method of the present invention for reading cells whose threshold values are influenced by the threshold values of their neighbors. One embodiment includes, for each cell, a circuit (preferably an analog circuit) for reading the values of the threshold voltages of the cell and of at least one of the cell's neighbors and for setting (a) respective reference voltage(s) for the cell based on the threshold values of the cell's neighbor(s). Note that the relationship between cells and circuits is not one-to-one: two or more cells may share the same circuit, but there is a circuit for every cell. The other embodiment is a digital embodiment whose controller obtains preliminary estimates of the threshold voltages of the cells by comparing the threshold voltages to (a) nominal reference voltage(s) that is/are common to all the cells and then, based on those preliminary estimates, determines respective adaptive reference voltages for the cells.

A second application of the basic method of the present invention is to reading the cells, of a flash memory, whose voltage bands drift over time. Each cell's threshold voltage is compared to at least one integral reference voltage and to at least one fractional reference voltage to determine at least one statistic of the cells' threshold voltages. At least one of the reference voltages then is adjusted in accordance with the at least one statistic.

The adjusting of the reference voltages is based on the statistics of the comparisons to the reference voltages. Therefore, preferably, the bit pattern corresponding to each voltage band defined by the integral threshold voltages is programmed to a sufficiently large number of cells to permit the determination of the at least one statistic.

The scope of the present invention also includes flash memories for implementing the basic method of the present invention and its various applications. Each flash memory includes a plurality of flash cells and either a controller or analog circuitry for managing the flash cells in accordance with the present invention.

Preferably, the controller, of the flash memory of the present invention that implements the method of the present invention for reading cells whose voltage bands drift over time, programs data received from a host to the cells of the flash memory. If the programming of the data results in too few of the cells' threshold values being within one of the cells' voltage bands for the method's statistics to be determined, then the controller selects a subplurality of the cells that includes a sufficient number of cells to provide adequate statistics. The controller then programs the threshold values of the cells of the subplurality to be within the under-represented voltage band.

BRIEF DESCRIPTION OF THE DRAWINGS

The invention is herein described, by way of example only, with reference to the accompanying drawings, wherein.

DESCRIPTION OF THE PREFERRED EMBODIMENTS

The present invention is a set of methods for reading flash memories more reliably than is possible according to the prior art.

The principles and operation of a flash memory according to the present invention may be better understood with reference to the drawings and the accompanying description.

Fractional Threshold Voltages

Figure 1:
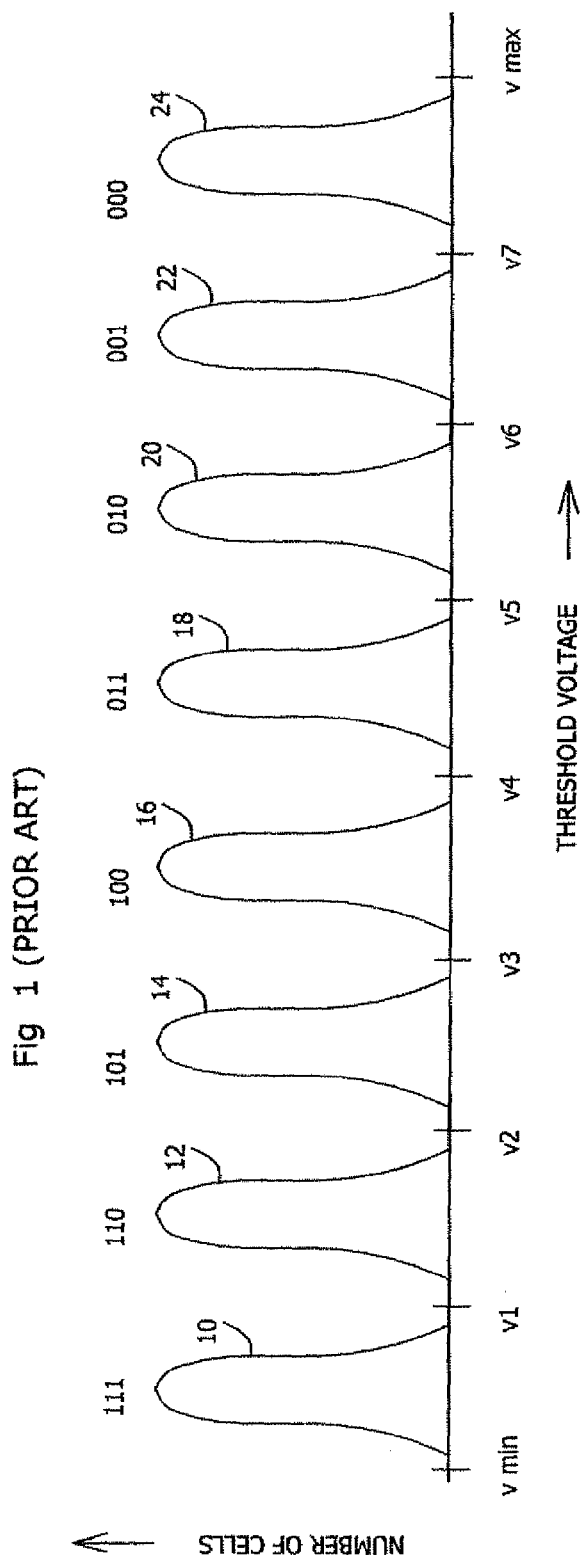
FIG. 1 illustrates the voltage bands of an eight-level flash cell.
Figure 2:
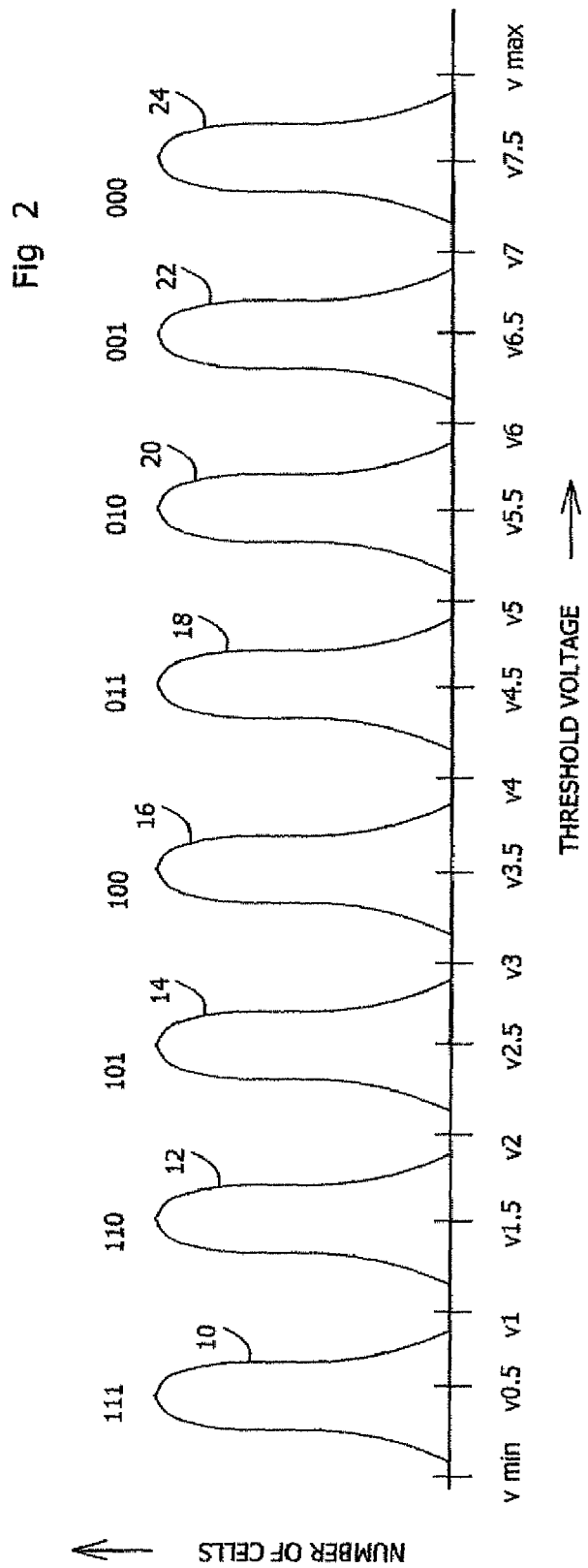
FIG. 2 is FIG. 1 including fractional reference voltages.

The basic innovation of the present invention is that, in addition to comparing the threshold voltages of flash cells to integral reference voltages, the threshold voltages also are compared to fractional reference voltages. Returning now to the drawings, FIG. 2 is FIG. 1 with the addition of eight fractional reference voltages, $V_{0.5}$, $V_{1.5}$, $V_{2.5}$, $V_{3.5}$, $V_{4.5}$, $V_{5.5}$, $V_{6.5}$ and $V_{7.5}$, in the centers of their respective voltage bands. In general, a flash cell for storing m bits has $2^m$ voltage bands and so has $2^m-1$ integral reference voltages. For example, in the case of a type 1 flash memory whose cells are read with m comparisons of a flash cell's threshold voltage to m of the $2^m-1$ integral reference voltages, reading such a flash cell according to the basic innovation of the present invention may also require comparing the flash cell's threshold voltages to one or more of the fractional voltages that lie between $V_1$ and $V_{2^m-1}$. For example, the last two comparisons of the flash cell's threshold voltage to the integral reference voltages $V_1$ through $V_{2^m-1}$ generally are to two consecutive such integral reference voltages. The fractional reference voltage to which the reference voltage then is compared typically lies between those two consecutive integral threshold voltages.

In the case of a type 2 flash memory whose cells are read by comparing the cells' threshold voltages to all $2^m-1$ integral reference voltages, the basic innovation of the present invention may require additional comparisons of the cells' threshold voltages to most or all of the fractional reference voltages that are defined to lie within the voltage bands.

The hardware that is used to compare a threshold voltage to fractional reference voltages is the same as the analog-to-digital hardware that is used in the prior art to compare a threshold voltage to integral reference voltages, for example a voltage comparator.

Figure 3:
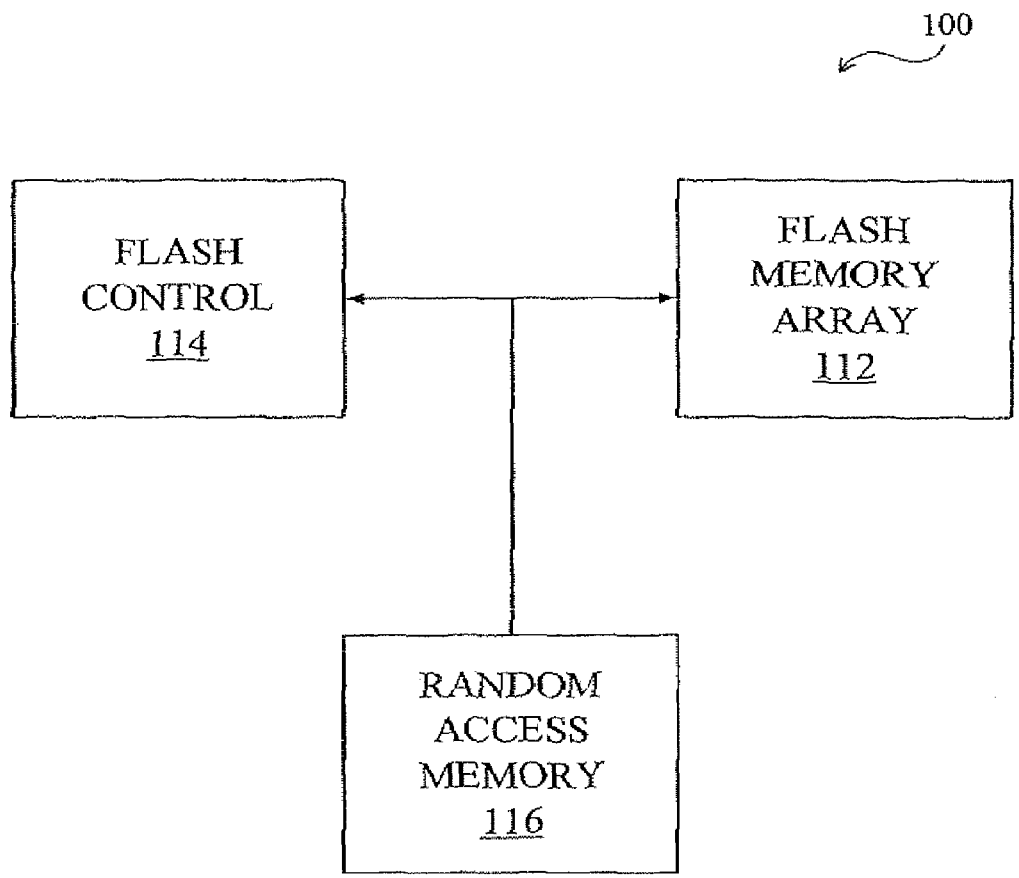
FIG. 3 is a high-level schematic block diagram of a device of the present invention.

FIG. 3 is a high-level schematic block diagram of a device 100 of the present invention. FIG. 3 is adapted from FIG. 1 of Ban, U.S. Pat. No. 5,404,485, which patent is incorporated by reference for all purposes as if fully set forth herein. Device 100 includes an array 112 of flash memory cells that are controlled by a controller 114 with the assistance of a random access memory 116 as described in U.S. Pat. No. 5,404,485. If array 112 is an array of NAND flash cells, then controller 114 preferably also manages array 112 as taught in Ban, U.S. Pat. No. 5,937,425, which patent also is incorporated by reference for all purposes as if fully set forth herein. In addition, controller 114 reads the contents of the flash memory cells of array 112 by comparing the threshold voltages of the flash memory cells to both integral reference voltages and fractional reference voltages.

Adaptive Reference Voltages

One aspect of the present invention, that optionally relies on comparing threshold voltages to fractional voltages, is intended to address a problem that arises in some flash technologies: the read circuitry is not able to measure accurately the threshold voltage of a single flash cell in isolation because the threshold voltage of every flash cell is influenced by the threshold voltages of its neighbors. Such a cross-effect exists in NROM flash technology in which two almost independent charges inside a single cell allow the storage of two bits per cell without recourse to MLC technology. However, it is not possible to read a single NROM charge in isolation with perfect accuracy because of the influence of the other charge on the read circuitry.

In NAND flash technology, cells are read by being placed on serial bit-lines. Although the read circuitry is able in principle to read the threshold voltage of a single NAND cell, in practice, cells on the bit-line affect the value read and limit the accuracy with which the value can be read.

Figure 4:
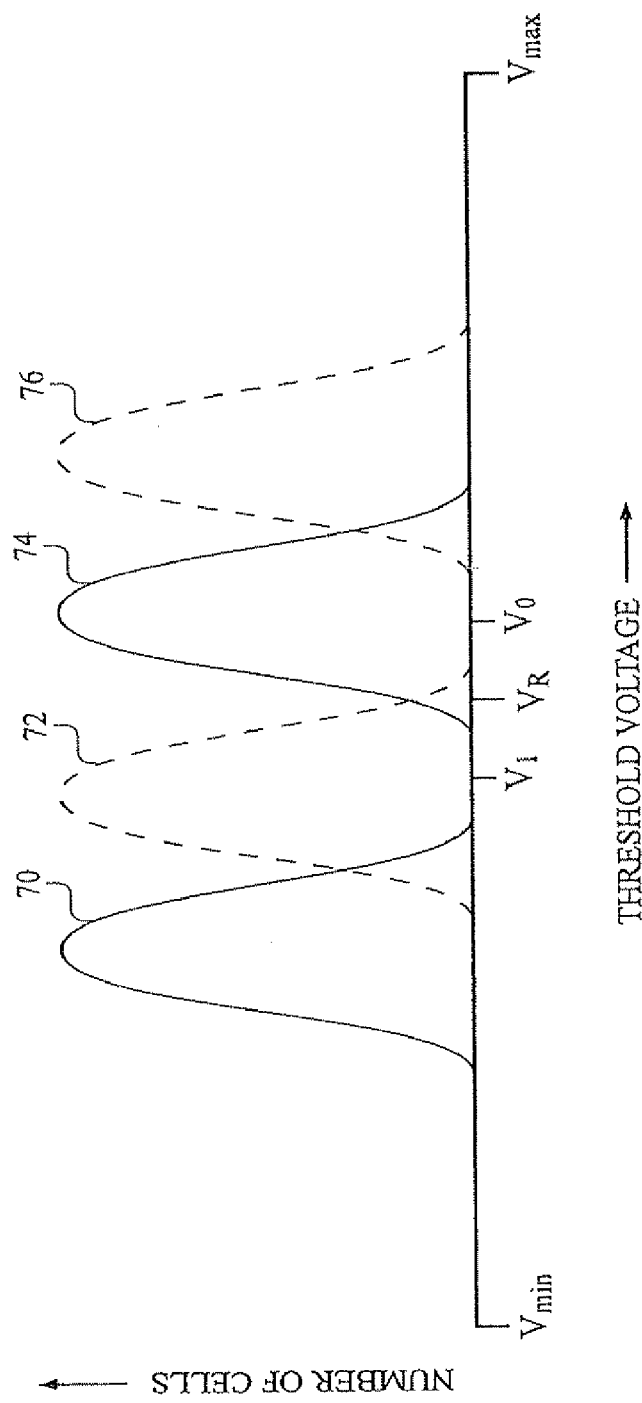
FIG. 4 illustrates the influence of neighboring cells on the threshold voltage distribution of SLC cells.

FIG. 4 illustrates this problem in the case of a single SLC cell affected by one other SLC cell. In FIG. 4, distribution curve 70 is the distribution curve of the threshold voltages of a population of SLC cells that nominally store "1" bits and whose neighbors nominally store "1" bits, distribution curve 72 is the distribution curve of the threshold voltages of a population of SLC cells that nominally store "1" bits and whose neighbors nominally store "0" bits, distribution curve 74 is the distribution curve of the threshold voltages of a population of SLC cells that nominally store "0" bits and whose neighbors nominally store "1" bits, and distribution curve 76 is the distribution curve of the threshold voltages of a population of SLC cells that nominally store "0" bits and whose neighbors nominally store "0" bits. According to the prior art, the reference voltage of a flash memory whose cells behave as illustrated in FIG. 4 is set at a compromise value of $V_R$. Because of the slight overlap of distribution curves 72 and 74, some of the cells that are programmed with "1"s are read as containing "0"s and some of the cells that are programmed with "0"s are read as containing "1"s. Ideally, two reference voltages would be used: a reference voltage $V_1$ for flash cells whose neighbors are programmed with "1"s and a reference voltage $V_0$ for flash cells whose neighbors are programmed with "0"s.

According to the present invention, when a target flash cell is read, first the threshold voltages of the target cell's neighbors are read, an appropriate reference voltage for the target cell (or more than one reference voltage if the flash cells are MLC cells) is determined based on the threshold voltages of the neighbors, and then the threshold voltage of the target cell is compared to the reference voltage (or to the reference voltages if the flash cells are MLC cells).

Figure 5:
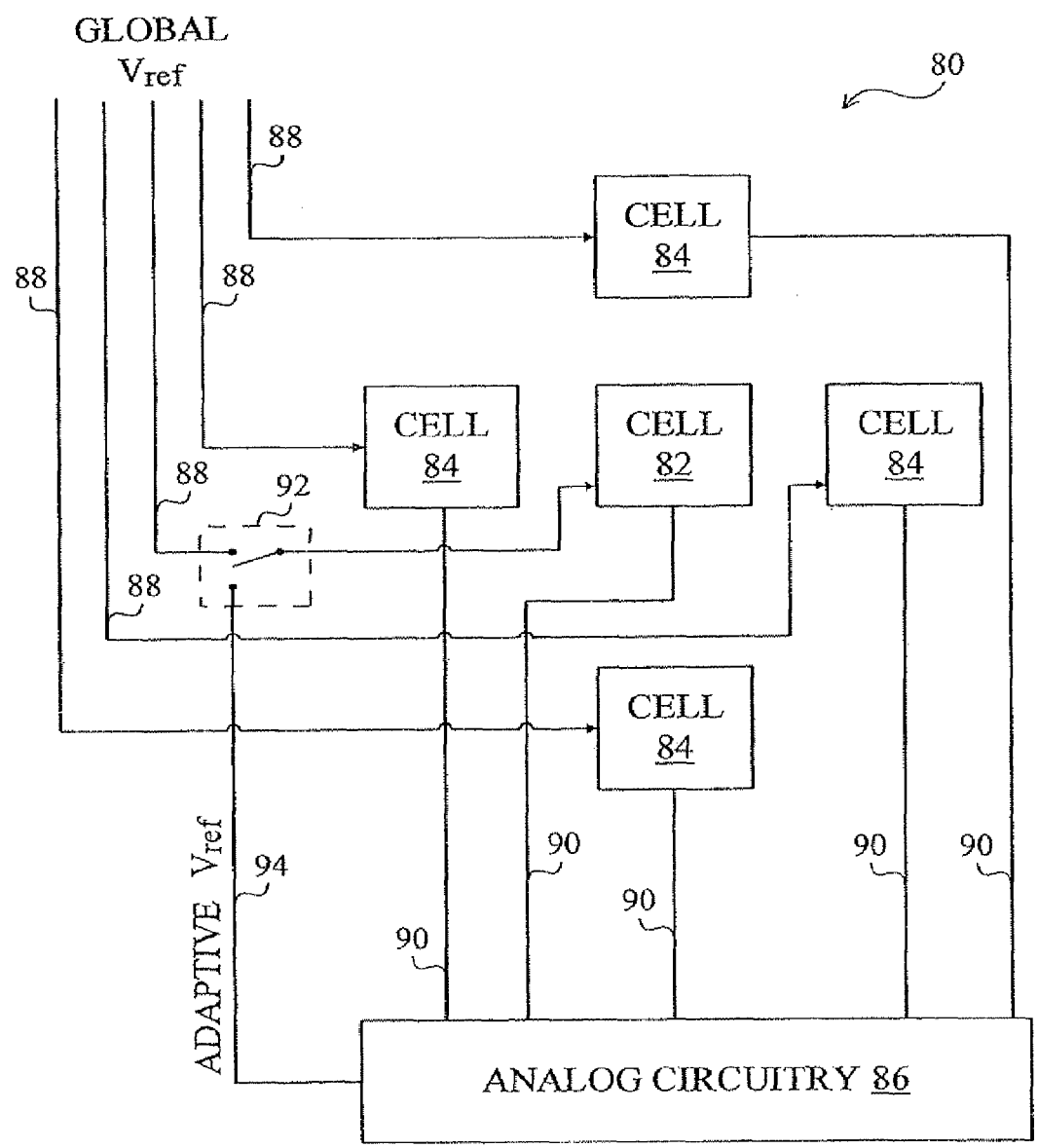
FIG. 5 is a partial high level schematic diagram of an analog embodiment of a flash memory device that addresses the problem illustrated in FIG. 5.

FIG. 5 is a partial high-level schematic diagram of an analog embodiment 80 of a flash memory device configured according to this aspect of the present invention. The flash cells of flash memory device 80 are SLC cells. FIG. 5 shows a target flash cell 82 and four neighboring flash cells 84. Lines 88 provide flash cells 82 and 84 with a global reference voltage. Analog circuitry 86 that is dedicated to target flash cell 82 senses the threshold voltages of flash cells 84, and optionally also of flash cell 82, via lines 90 and computes an adaptive reference voltage for target flash cell 82. A switch 92, that is initially set to connect target flash cell 82 to its line 88, is switched to connect target flash cell 82 to the output line 94 of analog circuitry 86 in order to provide target flash cell 82 with the adaptive reference voltage computed by analog circuitry 86. Each flash cell of flash memory device 80 has its own analog circuitry 86 and its own switch 92. For illustrational simplicity, only analog circuitry 86 and switch 92 of one flash cell (target flash cell 82) are shown in FIG. 5. A simple embodiment of analog circuitry 86 includes a voltage comparator that, based on the threshold voltages of flash cells 84, selects either a reference voltage ($V_1$ in FIG. 4) appropriate to a target flash cell 82 whose neighbors 84 store "1" bits or a reference voltage ($V_0$ in FIG. 4) appropriate to a target flash cell 82 whose neighbors 84 store "0" bits. A more refined embodiment of analog circuitry 86 averages the threshold voltages of neighboring flash cells 84, divides the average by a constant and adds the quotient to a baseline voltage to obtain the adaptive reference voltage of target flash cell 82. The average of the threshold voltages of neighboring flash cells is obtained, for example, using an analog adder and a voltage constant divider.

In a digital embodiment of a flash memory device configured according to this aspect of the present invention, the threshold voltages of the flash cells first are compared to nominal reference voltages that are common to all the cells, as in the prior art. For example, in the SLC case illustrated in FIG. 4, all of the threshold voltages are compared to $V_R$. This provides a set of preliminary threshold voltage estimates for all the flash cells. Then a respective adaptive reference voltage is selected for each flash cell according to the preliminary threshold voltages of the neighboring flash cells that affect its threshold voltage. For example, in the SLC case illustrated in FIG. 4, a flash cell whose neighbor has a preliminary threshold voltage greater than $V_R$ is assigned a respective adaptive reference voltage of $V_0$ and a flash cell whose neighbor has a preliminary threshold voltage less than $V_R$ is assigned a respective adaptive reference voltage of $V_1$. Then, the flash cells are read by comparing their threshold voltages to their respective adaptive reference voltages instead of to the global reference voltage(s). Optionally, this procedure is iterated until the bits inferred for all the flash cells do not change.

In a somewhat more sophisticated variant of this aspect of the present invention, the threshold voltages first are compared to both global integral threshold voltages and to global fractional threshold voltages. This allows the partitioning of the cells among more subpopulations with respective adaptive reference voltages. For example, in the SLC case illustrated in FIG. 4, a flash cell that has been programmed with a "0" bit and whose threshold voltage exceeds $(V_R+V_{max})/2$ is expected to bias upwards the threshold voltage of its neighbor more than a flash cell that has been programmed with a "0" bit but whose threshold voltage does not exceed $(V_R+V_{max})/2$. A flash cell whose neighbor's threshold voltage exceeds $(V_R+V_{max})/2$ therefore should be assigned an adaptive reference voltage higher than that assigned to a flash cell whose neighbor's threshold voltage does not exceed $(V_R+V_{max})/2$.

In addition to serving to illustrate a basic device 100 of the present invention and a device 100 for collective programming and reading of flash cells, FIG. 3 also illustrates a digital embodiment of a device 100 for reading an array 112 of flash cells using adaptive reference voltages. In addition to managing array 112 as described in U.S. Pat. No. 5,404,485 and U.S. Pat. No. 5,937,425, controller 114 also determines adaptive reference voltages for the cells of array 112 and reads the cells of array 112 by comparing their threshold voltages to their respective adaptive reference voltages, as described above.

The analog embodiments of this aspect of the present invention have the advantages of read speed and accuracy, at the expense of an extra unit cost per flash cell for the analog circuits, and at the expense of being restricted to the limited computational processing that can be done efficiently by analog circuits. The digital embodiments of this aspect of the present invention have the advantages of flexibility in design and ease of change, at the expense of (preferably) requiring read circuits with fractional resolution.

Self-Referencing

As noted above, the voltage bands of the cells of a flash memory tend to drift (typically downward) over time, either because of repeated programming/erasure cycles or because of not being programmed for a long time. Mehrotra et al. addressed this issue in U.S. Pat. No. 5,163,021 by providing special reference cells, programming and erasing the reference cells along with the flash cells for which they serve as references, and adjusting the global reference voltage(s) of those flash cells in accordance with the behavior over time of the reference cells.

According to the present invention, fractional reference voltages are used to enable flash cells that store user data to be used as their own reference cells. Consider, for example, a collection of SLC cells of a flash memory device, some of which are programmed to store "1" bits and some of which are programmed to store "0" bits. Comparing the threshold voltages of the cells to the integral reference voltage and to the fractional reference voltages of the flash memory device provides statistics of threshold voltages. Based on the statistics, the reference voltages are adjusted to reflect the actual distribution of threshold voltages. The more fractional voltages used to gather the statistics, the better the resolution of the actual distribution of threshold voltages.

For example, one way to determine how to adjust the single integral reference voltage $V_1$ of a collection of SLC cells is to compare the threshold voltages of the cells to $V_1$ and to two fractional reference voltages $V_{0.5}$ and $V_{1.5}$ in the centers of the "1" and "0" voltage bands, respectively. Let $V_{0.25}=(V_{min}+V_{0.5})/2$, $V_{0.75}=(V_{0.5}+V_1)/2$, $V_{1.25}=(V_1+V_{1.5})/2$ and $V_{1.75}=$ $(V_{1.5}+V_{max})/2$. The following pseudocode shows how to generate a statistical average that is an estimate of the true boundary between the distribution of the threshold voltages of the cells programmed to store "1" bits and the distribution of the threshold voltages of the cells programmed to store "0" bits, in a digital embodiment of this aspect of the present invention:

$N0=0$ $N1=0$ $Avg0=0$ $Avg1=0$ loop over cells if threshold voltage $<V_{0.5}$ then $N1=N1+1$ $Avg1=Avg1+V_{0.25}$ else if threshold voltage $<V_1$ then $N1=N1+1$ $Avg1=Avg1+V_{0.75}$ else if threshold voltage $<V_{1.5}$ then $N0=N0+1$ $Avg0=Avg0+V_{1.25}$ $N0=N0+1$ $Avg0=Avg0+V_{1.75}$ end loop $Avg0=Avg0/N0$ $Avg1=Avg1/N1$ estimate of true boundary$=(Avg0+Avg1)/2$ The value of $V_1$ then is set equal to the estimate of the true boundary. This method is accurate as long as not too many threshold values of cells that were programmed to store "0" bits have drifted below $V_1$. A second pass using the values thus obtained of all three adjusted threshold voltages produces a more accurate estimate of the desired value of $V_1$.

An analog embodiment of this aspect of the present invention would operate similarly, using analog measurements of the threshold voltages and analog circuitry to implement the arithmetic operations needed to obtain the required averages of the threshold voltages.

The advantage of this aspect over the present invention over the teachings of U.S. Pat. No. 5,163,021 is that the reference voltages are adjusted according to a statistical distribution of threshold voltages rather than according to the threshold voltages of a small number of reference cells. The disadvantage of this aspect of the present invention over the teachings of U.S. Pat. No. 5,163,021 is that the present invention relies on having adequate populations of all the relevant bit patterns stored in the flash cells to get reliable statistics. This problem becomes increasingly severe with increasing m. One solution to this problem is for the host of the flash memory to be programmed to always write a sufficiently wide variety of data to the flash memory to allow reliable statistics to be kept. This differs from the prior art of U.S. Pat. No. 5,163,021, inasmuch as the storage of special reference data according to the present invention is contingent on what kind of data the host application stores in the flash memory device. If the data that the host application stores in the flash memory device are sufficiently varied, no special provision need be made for special storage of reference data. In addition, even when the present invention reserves flash cells for storing reference data, it does so using ordinary flash cells, not specially designated flash cells with their accompanying special circuitry.

In addition to its other functions, FIG. 3 serves to illustrate a device 100 for implementing this aspect of the present invention. In addition to managing array 112 as described in U.S. Pat. No. 5,404,485 and U.S. Pat. No. 5,937,425, controller 114 also compares the threshold voltages of the cells of array 112 to fractional reference voltages and shifts the voltage bands in accordance with statistics derived from those measurements.

Alternatively, controller 114 monitors the variety of bit patterns stored in the cells of array 112 and, if necessary, itself programs a sufficient number of selected cells of array 112 with missing reference bit patterns to keep reliable statistics on those bit patterns. This differs from the prior art of U.S. Pat. No. 5,163,021, inasmuch as the designation and management of reference cells is done entirely in software, with no special circuitry needed.

While the invention has been described with respect to a limited number of embodiments, it will be appreciated that many variations, modifications and other applications of the invention may be made.

What is claimed is:

1. A method of reading a plurality of flash memory cells, comprising the steps of:
   (a) providing at least one integral reference voltage and at least one fractional reference voltage;
   (b) comparing a threshold voltage of each cell of the plurality to said at least one integral reference voltage and to said at least one fractional reference voltage to determine at least one statistic of said threshold voltages for the plurality of flash memory cells; and
   (c) adjusting at least one said reference voltage in accordance with said at least one statistic.

2. The method of claim 1, wherein said at least one integral reference voltage defines a plurality of voltage bands, the method further comprising the step of:
   (e) programming said threshold voltages of a sufficient number of said cells within each said voltage band to permit said at least one statistic to be determined.

3. A flash memory comprising:
   (a) a plurality of cells; and
   (b) a controller for reading said cells by:
      (i) providing at least one integral reference voltage and at least one fractional reference voltage,
      (ii) comparing a threshold voltage of each said cell of said plurality to said at least one integral reference voltage and to said at least one fractional reference voltage to determine at least one statistic of said threshold voltages for the plurality of flash memory cells, and
      (iii) adjusting at least one said reference voltage in accordance with said at least one statistic.

4. The flash memory of claim 3, wherein said at least one integral reference voltage defines a plurality of voltage bands, and wherein said controller is further operative:
   (i) to program said threshold voltages of said cells in accordance with data received from a host; and (ii) if, subsequent to said programming, too few of said threshold values are within one of said voltage bands to permit said determining of said at least one statistic:
(A) to select a subplurality of said cells sufficient in number to permit said determining of said at least one statistic if said threshold values of said cells of said subplurality are within said one voltage band, and
(B) to program said threshold voltages of said cells of said subplurality to be within said one voltage band.

5. A method of using a flash memory that includes a plurality of cells, comprising the steps of:
(a) writing data to the cells; and
(b) reading said data by steps including:
(i) providing at least one integral reference voltage and at least one fractional reference voltage,
(ii) comparing a threshold voltage of each cell of the plurality to said at least one integral reference voltage and to said at least one fractional reference voltage to determine at least one statistic of said threshold voltages for the plurality of flash memory cells, and
(iii) adjusting at least one said reference voltage in accordance with said at least one statistic.

6. A flash memory comprising:
(a) a plurality of cells; and
(b) a controller for:
(i) writing data to the cells, and
(ii) reading said data by steps including:
(A) providing at least one integral reference voltage and at least one fractional reference voltage,
(B) comparing a threshold voltage of each said cell of said plurality to said at least one integral reference voltage and to said at least one fractional reference voltage to determine at least one statistic of said threshold voltages for the plurality of flash memory cells, and
(C) adjusting at least one said reference voltage in accordance with said at least one statistic.

7. A method of programming and reading a plurality of flash memory cells, comprising the steps of:
(a) programming each cell to a respective one of a first plurality of threshold voltage states;
(b) determining, for each of at least two threshold voltage states selected from a second plurality of threshold voltage states, a number of cells of at least a portion of the cells in said each threshold voltage state;
(c) selecting at least one reference voltage according to said numbers; and
(d) using said at least one reference voltage to read the cells.

8. The method of claim 7, wherein said first and second pluralities of threshold voltage states are identical.

9. A flash memory comprising:
(a) a plurality of cells; and
(b) a controller for:
(i) programming each said cell to a respective one of a first plurality of threshold voltage states,
(ii) determining, for each of at least two threshold voltage states selected from a second plurality of threshold voltage states, a number of said cells of at least a portion of said cells in said each threshold voltage state,
(iii) selecting at least one reference voltage according to said numbers, and
(iv) using said at least one reference voltage to read said cells.

10. The flash memory of claim 9, wherein said first and second pluralities of threshold voltages are identical.

* * * * *